United States Patent [19]

Albarello

[11] 4,244,030
[45] Jan. 6, 1981

[54] MULTIPLEXED FILTERING DEVICE

[75] Inventor: Alain Albarello, Paris, France

[73] Assignee: Thomson-CSF, Paris, France

[21] Appl. No.: 963,945

[22] Filed: Nov. 27, 1978

[30] Foreign Application Priority Data

Nov. 30, 1977 [FR] France .................... 77 36040

[51] Int. Cl.³ .............. H03H 15/02; H03H 9/64; H01L 29/78
[52] U.S. Cl. .................. 364/825; 328/167; 333/165; 364/862; 370/77
[58] Field of Search .............. 328/167; 364/862, 724, 364/825, 826, 827; 333/165, 166, 167

[56] References Cited

U.S. PATENT DOCUMENTS

| 4,045,795 | 8/1977 | Fletcher et al. | 364/862 |
| 4,063,200 | 12/1977 | Mattern | 333/165 |
| 4,123,733 | 10/1978 | Poirier | 333/165 |
| 4,126,794 | 11/1978 | Tompsett | 333/165 |
| 4,145,675 | 3/1979 | Picquendar | 333/165 |
| 4,145,676 | 3/1979 | Benoit-Gonin et al. | 333/165 |

FOREIGN PATENT DOCUMENTS 2434259 2/1975 Fed. Rep. of Germany .......... 333/166

Primary Examiner—Felix D. Gruber
Attorney, Agent, or Firm—Cushman, Darby & Cushman

[57] ABSTRACT

In a multiplexed filtering device the first and second input signals are respectively sampled to give a third signal and sampled and delayed to give a fourth signal. An adder whose output is connected to the control electrode of a charge transfer device of a hybrid filter, adds alternately the third signal to a sampled signal corresponding to the third signal and coming from the recursive part of the hybrid filter and the fourth signal to a sampled signal corresponding to the fourth signal and coming from the recursive part of the hybrid filter. The output signals of the non-recursive part of the hybrid filter are summed by a reading amplifier, the output of which constitutes the output of the hybrid filter; after which they are demultiplexed and delayed for the restoration of the first input signal and only demultiplexed for the restoration of the second input signal.

5 Claims, 8 Drawing Figures

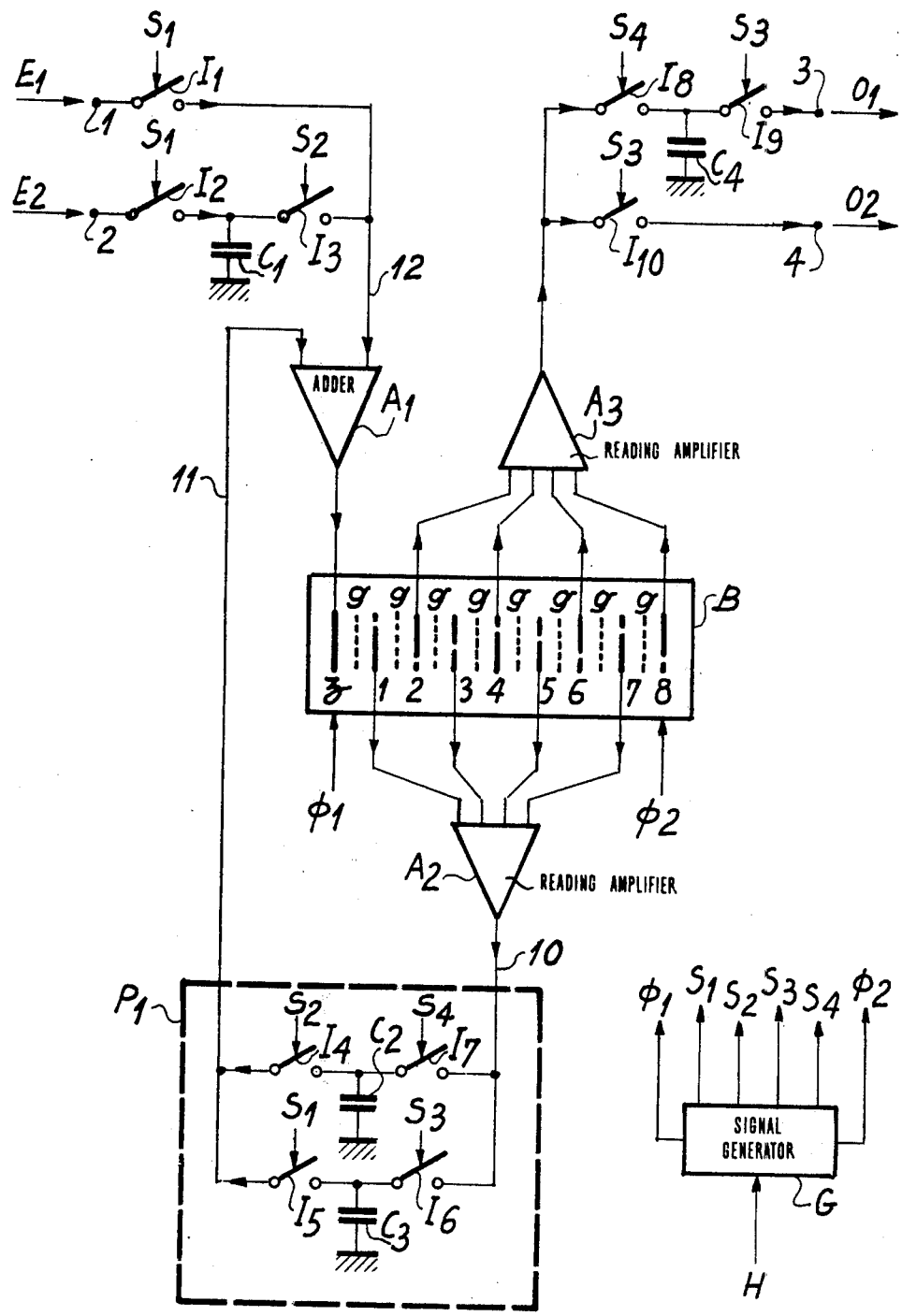
Fig_1

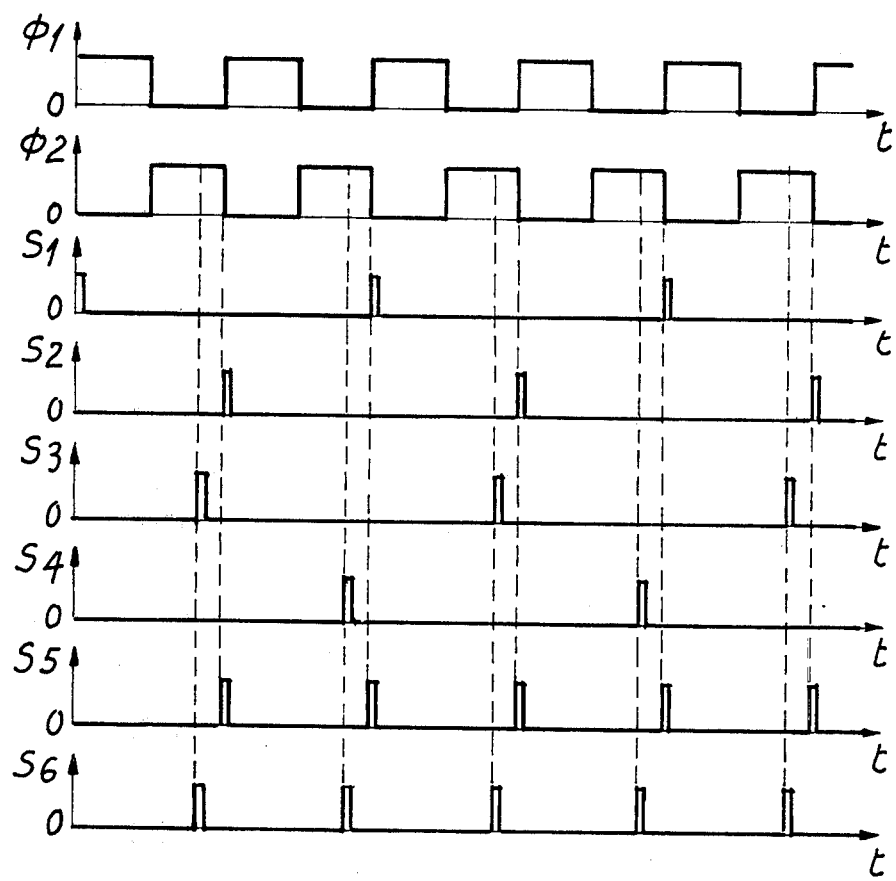
Fig_2
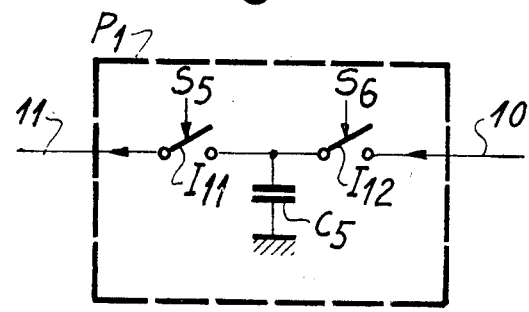
Fig_3

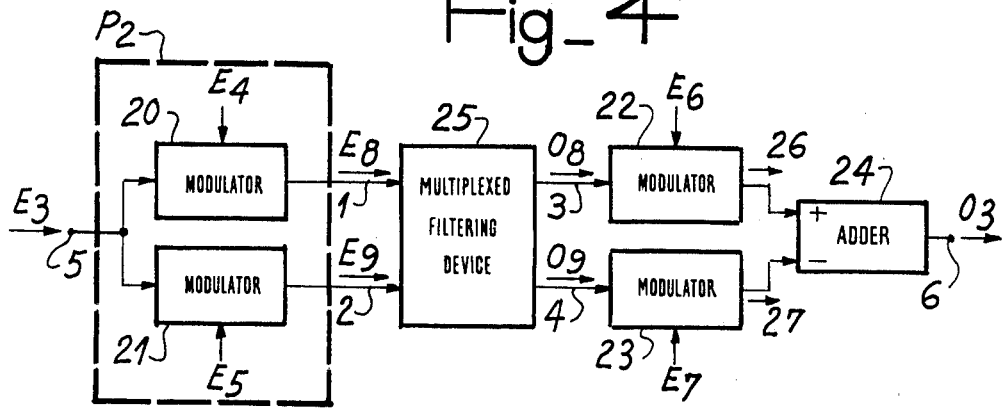
Fig_4
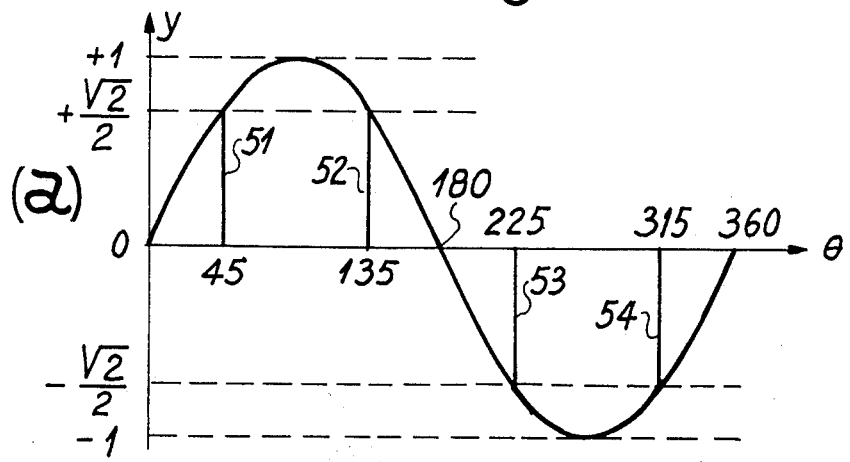
Fig_5 (a)
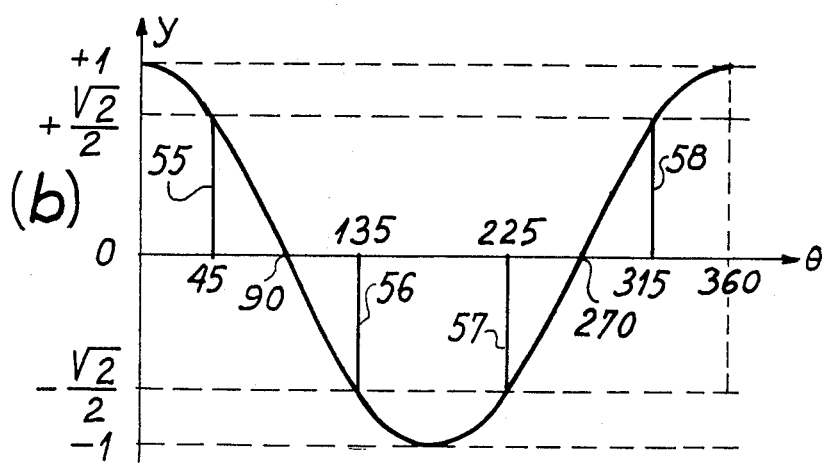
(b)

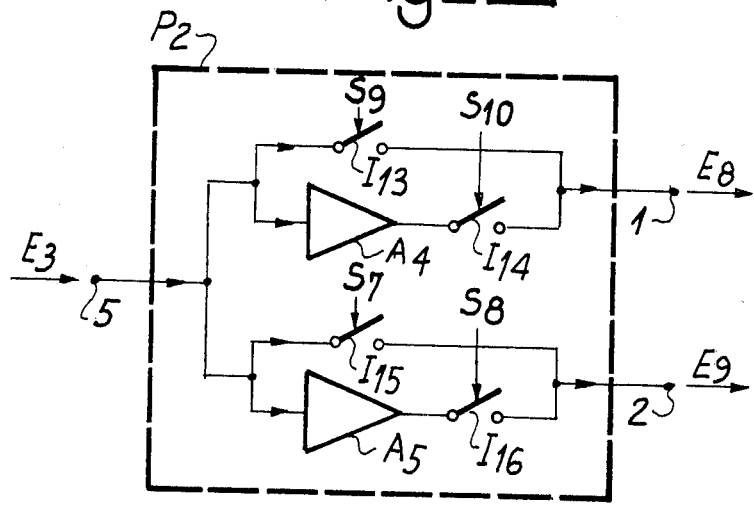
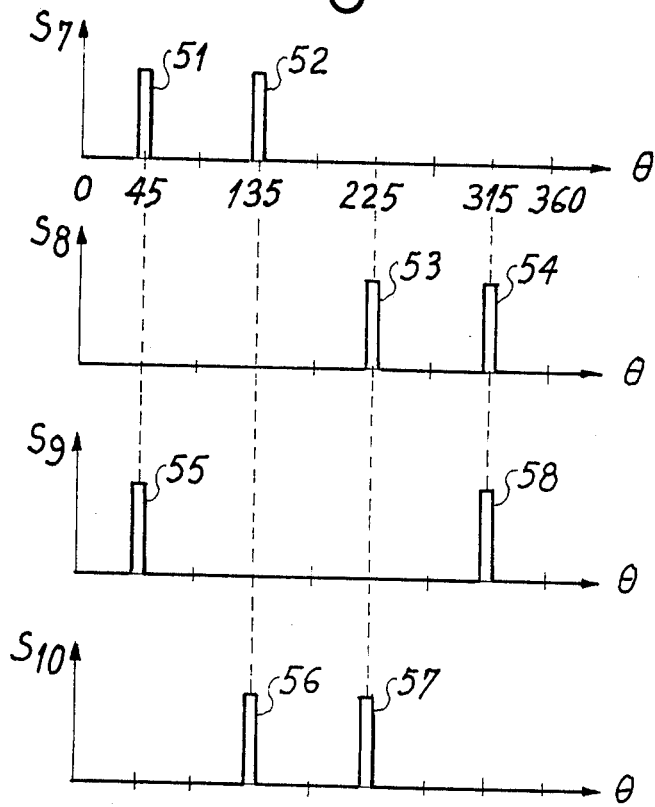

MULTIPLEXED FILTERING DEVICE

The present invention relates to multiplexed filtering devices including in series timed multiplexing means, a filter, and demultiplexing means, enabling analog signals corresponding to two transmission channels to be filtered as identically as possible.

The use of a digital filter generally comprising a circuit for weighted, delayed feedback of the output signal is already known; such a filter is termed a "recursive" filter; a filter is known as "non-recursive" if it does not comprise this feedback circuit. The required performances are obtained, but this filtering necessitates the presence of analog to digital and digital to analog conversion means in addition to the components of the digital filter itself. These make the device very costly.

It is possible to manufacture such multiplexed filtering devices which are not attended by the aforementioned disadvantages to such an extent as some of the previously proposed multiplexed filtering devices, but which, at the same time, retain the aforementioned advantages.

According to the invention, there is provided a multiplexed filtering device including in series: multiplexing means having a first and a second input for receiving respectively a first and a second analog signal for filtering, a control input for receiving sampling signals having a predetermined frequency, and an output; filtering means having an input coupled to the output of said multiplexing means and an output; and demultiplexing means having a signal input, a control input for receiving sampling signals at said predetermined frequency and two outputs; said filtering means comprising: a first adder having a first input coupled to the input of said filtering means, a second input and an output; a split and interlaced electrode type charge transfer filter having a first group of electrodes coupled to the output of said first adder and a second group of electrodes coupled to the output of said filtering means; a second adder having an input coupled to said first group of electrodes and an output; and switching and storage means having an input coupled to the output of second adder and an output coupled to the second input of said first adder.

The present invention will be more easily understood, and other features will be illustrated by the description that follows and the corresponding diagrams, wherein:

FIG. 1 is a diagram representing a preferred form of embodiment of the device according to the invention;

FIG. 2 represents diagrams indicating voltage as a function of time for the control signals determining the functionning of the device according to FIG. 1;

FIG. 3 is an alternative form of a component of FIG. 1;

FIG. 4 is a diagram representing a single-sideband modulator using a multiplexed filtering device according to the invention;

FIGS. 5a and 5b are explanatory diagrams relating to FIG. 4;

FIG. 6 represents an alternative form of a component of FIG. 4;

FIG. 7 represents explanatory diagrams relating to FIG. 6.

Those components that correspond exactly form one figure to another are designated by the same reference numbers.

In FIGS. 1, 3 and 6, switches identified by the general symbol I are represented as being of the mechanical type in order to simplify the drawing but, in fact, in the preferred form of embodiment described, they are electronic switches whose associated arrows, generally represented by 5, are used to identify their control signals whose forms are illustrated in FIG. 2, these switches being open when the signal is zero.

In FIGS. 1, 4 and 6, the signals are identified by the following general symbols: E for an input signal and 0 for an output signal; an arrow indicates the direction of propagation of the signals.

FIG. 1 shows a charge transfer device (abbreviated to CTD), B, of conventional design, which is the basic element of a filter. Only an input control electrode, z, and eight cells each comprising a first electrode, g, and a second electrode are shown. The eight second electrodes are numbered 1 to 8; they are split, using a technique known in the art, in order to weight the correspondng voltage read by reading amplifiers, $A_3$ and $A_2$, having four inputs, on the even-numbered electrodes 2, 4, 6, 8 and odd-number electrodes 1, 3, 5, 7 respectively.

A first input terminal, 1, receives a signal $E_1$, applied to an input, 12, of an adder $A_1$, via a switch, $I_1$, controlled by signal $S_1$.

A second input terminal, 2, receives a signal $E_2$, applied to the input 12 of adder $A_1$, via two series connected switches, $I_2$ and $I_3$, having a common pole connected to earth by a capacitor $C_1$; these switches are controlled respectively by signals $S_1$ and $S_2$. At a second input, 11, adder $A_1$ receives the output signal of reading amplifier $A_2$, via switching and storage means, $P_1$, which have an input terminal 10. The output of adder $A_1$ is connected to the control electrode, z, of the CTD.

The switching and storage means $P_1$ are constituted by two channels in parallel comprising, in the case of the first channel, two series connected switches, $I_4$ and $I_7$, having a common pole connected to earth by a capacitor, $C_2$, and actuated by signals $S_2$ and $S_4$ respectively, and, in the case of the second channel, two series connected switches, $I_5$ and $I_6$, having a common pole connected to earth by a capacitor $C_3$, and controlled respectively by signals $S_1$ and $S_3$.

Reading amplifier $A_3$ supplies: at a first output terminal, 3, a signal $O_1$ via a channel including in series two switches, $I_8$ and $I_9$, having a common pole connected to earth by a capacitor $C_4$ and controlled respectively by signals $S_4$ and $S_3$ and at a second output terminal, 4, a second signal $O_2$ via a channel, parallel to the preceding channel, comprising a switch $I_{10}$, controlled by signal $S_3$.

On the basis of a clock signal H, a signal generator G provides, on one hand, the two signals $\phi_1$ and $\phi_2$, in phase opposition, ensuring that the charges pass through the CTD, and respectively applied to electrodes g and to electrodes 1 to 8, and, on the other hand, the control signals, $S_1$, $S_2$, $S_3$ and $S_4$ of the different switches illustrated in FIG. 1.

The assembly constituted by switches $I_1$, $I_2$, $I_3$ and by capacitor $C_1$, constitutes the timed multiplexing means enabling multiplexing and sampling of the two input signals $E_1$ and $E_2$ which are applied to input 12 of adder $A_1$, which is also the input of the charge transfer filter. This filter is a hybrid filter comprising a 'recursive' part including: the adder $A_1$, the odd-numbered electrodes of the CTD, B, the reading amplifier $A_2$ and the switching and storage means $P_1$; the filter also comprises a "non-recursive" part including: adder $A_1$, the even-numbered electrodes of CTD, B, and the reading amplifier $A_3$. The output of reading amplifier $A_3$ constitutes the output of the filter. In the CTD, B, in addition to conventional charge transfer, electrodes g enable samples of an input signal ($E_1$ for example) to be stored while the samples of the other input signal ($E_2$) are read on electrodes 1 to 8 by amplifiers $A_2$ and $A_3$.

The samples of filtered signals $E_1$ and $E_2$ are then demultiplexed by the assembly formed by switches $I_8$, $I_9$, $I_{10}$ and by capacitor $C_4$ which constitute the demultiplexing means and which supply the output signals $O_1$ and $O_2$ respectively representing sampled and filtered signals $E_1$ and $E_2$.

FIG. 2 represents signals $\phi_1$ and $\phi_2$, as well as the control signals, $S_1$ and $S_2$, which are synchronous with the leading edge of signal $\phi_1$ but whose recurrence frequency is half thereof, and sample and multiplex the input signals $E_1$ and $E_2$. Signals $S_3$ and $S_4$, whose recurrence frequency is half that of the signal $\phi_2$, have a slight phase lead in relation to the trailing edge of $\phi_2$ in order to enable to take into account, between two transfer operations, the voltages read on electrodes 1 to 8 of the CTD by reading amplifiers $A_2$ and $A_3$.

Input signals $E_1$ and $E_2$ are sampled simultaneously by switches $I_1$ and $I_2$ respectively controlled by signal $S_1$. The sample of signal $E_1$ is applied to electrode z of the CTD, while that of signal $E_2$ is stored in capacitor $C_1$.

The synchronism of signals $S_1$ and $\phi_1$ enables a quantity of charges proportional to the amplitude of the sample of signal $E_1$ to be injected beneath electrode g which follows electrode z. Then, when the signal $\phi_1$ becomes zero and signal $\phi_2$ becomes positive, the charges contained beneath electrode g are transferred beneath electrode 1. When all these charges are stored, they are read by amplifier $A_2$ and stored in capacitor $C_3$ via switch $I_6$. The same process is repeated for the sample of signal $E_2$ (stored in capacitor $C_1$) which is applied to electrode z via switch $I_3$, controlled by signal $S_2$ synchronous with $\phi_1$, and adder $A_1$; the corresponding charge is stored beneath electrode g adjacent to electrode z. During this time, the charge corresponding to the sample of signal $E_1$ is transferred from electrode 1 to following electrode g. When the signal $\phi_1$ becomes zero and $\phi_2$ becomes positive, the charge corresponding to the sample of signal $E_2$ is transferred beneath electrode 1, and read by amplifier $A_2$, after which it is stored in capacitor $C_2$.

Thereupon, the cycle commences again for signal $E_1$, this time with summation of the new sample and of the contents of capacitor $C_3$ (contents transferred via switch $I_5$ and representing the preceding sample of signal $E_1$). The cycle then continues in the same way with signal $E_2$ and the contents of capacitor $C_2$. When these charges are stored beneath the even-numbered electrodes, they are read by reading amplifier $A_3$ which, after filtering, restores samples corresponding to those of the input signals $E_1$ and $E_2$. These filtered samples are demultiplexed as follows: in a first stage, the filtered signals of signal $E_1$ are stored in capacitor $C_4$ (via switch $I_8$); then the filtered samples of signal $E_2$, transmitted by switch $I_{10}$, constitute the output signal $O_2$ and, simultaneously, the filtered samples of signal $E_1$, contained in capacitor $C_4$, and transmitted by switch $I_9$, constitute the output signal $O_1$. It should be pointed out in this connection that all the charges corresponding to the samples of signal $E_1$ are stored alternately beneath electrodes 1 to 8, followed by all the charges corresponding to the samples of signal $E_2$, therefore switches $I_6$ and $I_{10}$, on one hand, and that of $I_7$ and $I_8$ on the other hand are in synchronism. Furthermore, it should be noted that the assembly formed by capacitor $C_4$ and switch $I_9$ constitutes a delay means for the filtered samples of signal $E_1$; the delay enables synchronism of the samples of signals $O_1$ and $O_2$ after filtering.

The filtering function is not further described as it is a conventional one, and one method of synthesis, among several possible methods, for such a function is set forth in the article entitled "An algorithmic Procedure for Designing Hybrid FIR/IIR Digital Filters" published by M. R. Campbell et al. in the review: The Bell System Technical Journal, Volume 55, No. 1 of January 1976.

FIG. 3 represents another form of embodiment of sub-assembly $P_1$ of FIG. 1. Between its input, 10, and its output, 11, two series connected switches, $I_{11}$ and $I_{12}$, have a common pole connected to earth via a capacitor $C_5$ and are controlled respectively by signals $S_5$ and $S_6$. These signals, supplied by the generator G of FIG. 1, are obtained by summing the signals $S_1$ and $S_2$ in the case of signal $S_5$ and by summing the signals $S_3$ and $S_4$ in that of signal $S_6$. Their recurrence frequency is thus double that of signals $S_1$ to $S_4$.

Switch $I_{12}$ allows alternating storage in capacitor $C_5$ of the charges corresponding to the samples of signals $E_1$ and $E_2$ read by amplifier $A_2$ on the odd-numbered electrodes of CTD B. Switch $I_{11}$ enables the charges stored in capacitor $C_5$ to be transmitted to input 11 of adder $A_1$ in synchronism with the samples of the input signals occuring at input 12 of summator $A_1$.

An application of the charge transfer multiplexed filtering device to a Weaver single-sideband modulator will be described hereinafter.

FIG. 4 shows an input signal, $E_3$, applied to an input terminal, 5, which is connected to a first input terminal of two identical modulators, 20 and 21, constituting an assembly, $P_2$. These modulators receive respectively signals, $E_4$ and $E_5$, at a second input terminal and deliver, at their output, respectively signals, $E_8$ and $E_9$, which are applied respectively to two input terminals, 1 and 2, of a circuit, 25. This circuit is a charge transfer multiplexed filtering device whose structure is identical to that of the device of FIG. 1: to its output terminals, 3 and 4, respectively, it delivers signals $O_8$ and $O_9$ which are applied respectively to a first input terminal of two identical modulators, 22 and 23. At their second input terminal, these modulators receive signals $E_6$ and $E_7$ respectively and deliver at their outputs signals, 26 and 27, respectively which are applied respectively to the (+) and (−) input terminals of an adder, 24. This adder delivers the signal $O_3$ at its output, 6.

The input signal $E_3$ is a modulating signal with a frequency F which is multiplied in the modulators, 20 and 21, respectively by two signals, $E_4$ and $E_5$, having a frequency $F_1$ ($F_1$ being an intermediate carrier frequency) of equal amplitude but in phase quadrature. The output signals, $E_8$ and $E_9$, of these modulators are therefore composed, in the spectral range, of two lateral lines of equal amplitude and frequencies $F_1+F$ and $F_1-F$ and the lateral lines of signal $E_8$ are in quadrature with those of signal $E_9$.

The signals, $E_8$ and $E_9$, are then multiplexed and filtered by the circuit, 25, which is a low-pass filter with a cut-off frequency $F_1$, enabling the upper lateral line of these two signals to be eliminated, and supplying at its output the two sampled signals $O_8$ and $O_9$.

These sampled signals having the same frequencies $F_1-F$ but being in the phase quadrature, are integrated respectively in the input circuits of modulators 22 and 23 by means of an RC cell in order to provide smoothed analog signals. In addition, modulators 22 and 23 effect the multiplication of smoothed signals $O_8$ and $O_9$ respectively by signals $E_6$ and $E_7$ having the same amplitude and the same frequency $F_p-F_1$ ($F_p$ being the carrier frequency of the output signal) but in phase quadrature.

The output signals, 26 and 27, of these modulators are composed, in the spectral range, of two lateral lines of equal amplitude and frequencies $F_p-F$ and $2F_1-F-F_p$.

However, if the phases of the lines at the frequency $2F_1-F-F_p$ are the same for two signals, the phases of the lines at frequency $F_p-F$ are in opposition. Thus, when algebraic summation is carried out by adder 24, a signal appears at the output 6 of this adder which only comprises the lateral below line at frequency $F_p-F$ and which constitutes the single-sideband modulated signal $O_3$.

The advantage of this modulator is that rigorously identical filtering is obtained for each transmission channel, which can be achieved at only one frequency with two different low-pass filters as in the case of the conventional Weaver modulator.

By means of the multiplexed filtering method, it has been possible to obtain better balancing ot the two transmission channels. However, the fact that each channel comprises two different modulators leads, as their caracteristics are not rigorously identical, to another source of unbalance that it is desirable to reduce. This unbalance can be reduced considerably by replacing modulators 20 and 21 by other operators, and the analog signals, $E_4$ and $E_5$, in phase quadrature by correctly sampled signals.

A digital method enabling this modification to be effected is described herebelow.

FIG. 5a represents a sine function $y=\sin\theta$ limited to a period taken between $\theta=0°$ and $\theta=360°$. It can be seen that, if this function is sampled at moments corresponding to angles 45°, 135°, 225°, 315°, one obtains four samples uniformly distributed in time ($\theta$ being a linear time function), 51, 52, 53, 54, having the same modulus $\sqrt{2}/2$ (1 being the positive extremum of the function), the first two being positive and the last two negative.

The respective amplitude conditions between a carrier wave and a modulating signal can be expressed (a standard level being fixed for the carrier wave) as a proportionality factor applied to the modulating signal. It is then justifiable to fix a level for the carrier wave equal to $2/\sqrt{2}$, 1 then being the modulus value of the samples.

Signal multiplication will then be extremely simple and will consist of multiplying the modulating signal by a series of numbers such as +1, +1, −1, −1, taken at the moments indicated above.

As shown in FIG. 5a, such a series of samples represents both a sine function and a cosine function since the difference between the two corresponds only to a difference in time origins. Samples 51, 52, 53, 54 are those of a sine wave signal and correspond to the above-mentioned series of numbers; samples 55, 56, 57, 58 are those of a cosine signal and correspond to the series of numbers +1, −1, −1, +1. If, therefore, as it is sometimes necessary to do, two carrier waves with a phase difference of 90° have to be modulated by the same modulating signal, said signal will be multiplied, on one hand as described above, and, on the other hand, by the series of numbers +1, −1, −1, +1, taken at the same moments; these multiplication operations consists simply in changes of sign.

This method is applied to assembly $P_2$ of FIG. 4; the working of the other components of this figure is not modified.

FIG. 6 shows the input terminal, 5, of assembly $P_2$; this terminal receives the signal $E_3$ which is applied in parallel to the inputs of two switches, $I_{13}$ and $I_{15}$, and of two amplifiers with a gain of −1, $A_4$ and $A_5$. The outputs of amplifiers $A_4$ and $A_5$ are connected respectively to the inputs of switches $I_{14}$ and $I_{16}$, whose outputs, which are connected to the corresponding outputs of switches $I_{13}$ and $I_{15}$, deliver respectively to the output terminals, 1 and 2, the signals $E_8$ and $E_9$ of this assembly $P_2$.

FIG. 7 represents the four control signals, $S_7$, $S_8$, $S_9$ and $S_{10}$, of the four switches $I_{13}$, $I_{14}$, $I_{15}$ and $I_{16}$. The pulses numbered 51 to 58 correspond to the signals obtained after sampling the sine curve and the cosine curve of FIG. 5. The assembly of switches $I_{13}$, $I_{14}$, and of amplifier $A_4$ is the equivalent of modulator 20 (FIG. 4), and the assembly of switches, $I_{15}$, $I_{16}$, and of amplifier $A_5$, constitutes the equivalent of modulator 21 (FIG. 4). However, these last two assemblies differ from modulators 20 and 21 in that they supply sampled signals.

The output signals, $E_8$ and $E_9$, (FIG. 6) then constitute the input signals of circuit 25 (FIG. 4) but correct operation only occurs if the sampling frequencies of the modulators thus designed and of the multiplexed filter are synchronous.

The present invention is not limited to the form of embodiment that has been described and represented; in particular, the device can have alternative forms of embodiment.

The different control and clock signals of the multiplexed filter relate to an N channel charge transfer device, but the same result can be obtained with a P channel charge transfer device. Similarly, the hybrid filter is of the interlaced electrode type but the design of such hybrid filters, the recursive and non-recursive parts of which are not interlaced, is known in the art.

Weighting of the voltages read on the electrodes can be external to the CID; it can be obtained for example at the reading amplifiers $A_2$ and $A_3$ by weighting their inputs.

In addition, the charge transfer device used is a CTD controlled by a two-phase clock, but it is also possible to use a CTD controlled by a three-phase clock. The latter two alternatives are conventional in the techniques of CTD use.

Finally, it is possible to use this charge transfer filtering device in other systems, for example in Hartley phase angle modulators and in single-sideband demodulators.

Of course, the invention is not limited to the embodiments described and shown which were given solely by way of example.

What is claimed is:

1. A multiplexed filtering device comprising
multiplexing means for producing a multiplexed output signal and having a first and a second input for receiving respectively a first and a second analog signal to be filtered, a control input for receiving sampling signals having a predetermined frequency and an output;

a first adder having two inputs and an output, the first input being coupled to the output of said multiplexing means to receive said multiplexed output signal;

demultiplexing means for producing demultiplexed outputs and having a signal input, a control input for receiving sampling signals at said predetermined frequency, and two outputs on which outputs filtered signals are produced which correspond to said analog signals;

a second adder having an input and an output;

switching and storage means for coupling the output of said second adder to the second input of said first adder;

an amplifier; and a charge transfer filter of split and interlaced electrode type, including a series of split electrodes alternating with another series of electrodes, in alignment arrangement with a signal electrode connected to said output of said first adder, said split electrodes being divided into two groups odd-numbered and even-numbered, the electrodes of one group being connected to the input of said amplifier and the output of said amplifier being connected to said demultiplexing means input, and the electrodes of the other group being connected to the input of said second adder.

2. A multiplexed filtering device as claimed in claim 1, wherein said multiplexing means includes a first switch for coupling together the first input and the output of said multiplexing means, a sampler and a second switch connected in series, and having a common pole, for coupling together with the second input and the output of said multiplexing means and a reactive element for coupling said common pole to earth, wherein said predetermined frequency is at least equal to twice the greatest frequency of said analog signals, wherein said demultiplexing means includes a third switch and a sampler connected in series, and having a common pole for coupling the output of said filtering means to one of said outputs of said demultiplexing means, and a fourth switch for coupling the output of said amplifier to the other one of said outputs of said demultiplexing means and a reactive element for coupling said common pole of said two switches to earth, and wherein said swtiches and said samplers are controlled at said predetermined frequency.

3. A multiplexed filtering device as claimed in claim 1, wherein said switching and storage means include two identical channels in parallel, each channel includes two series connected switches having a common pole, and a reactive element for coupling said common pole to earth and wherein said switches are controlled at a recurrence frequency equal to said predetermined frequency.

4. A multiplexed filtering device as claimed in claim 1, wherein said switching and storage means comprise two series connected switches having a common pole and a reactive element for coupling said common pole to earth and wherein said switches are controlled at a recurrence frequency of twice said predetermined frequency.

5. A multiplexed filtering device as in claim 1 wherein said one group is the even-numbered group and said other group is the odd-numbered group.

* * * * *